United States Patent [19]
Ackland et al.

[11] Patent Number: 5,220,325
[45] Date of Patent: Jun. 15, 1993

[54] HIERARCHICAL VARIABLE LENGTH DECODER FOR DIGITAL VIDEO DATA

[75] Inventors: Bryan D. Ackland, Old Bridge; Hemant Bheda; Joseph H. Othmer, both of Freehold, all of N.J.

[73] Assignee: AT&T Bell Laboratories, Murray Hill, N.J.

[21] Appl. No.: 676,633

[22] Filed: Mar. 28, 1991

[51] Int. Cl.⁵ .................. H03M 7/40; H03M 7/46
[52] U.S. Cl. .................... 341/67; 341/106; 341/59
[58] Field of Search .............. 341/67, 106, 50, 59

[56] References Cited

U.S. PATENT DOCUMENTS

| | | | |
|---|---|---|---|
| 3,918,047 | 11/1975 | Denes | 341/67 |
| 4,396,906 | 8/1983 | Weaver | |
| 4,475,174 | 10/1984 | Kanayama | 341/67 X |
| 4,568,916 | 2/1986 | Bahgat | 341/67 |
| 4,992,954 | 2/1991 | Takeda et al. | 341/67 X |
| 5,016,009 | 5/1991 | Whiting et al. | 341/67 |
| 5,021,782 | 6/1991 | Perron et al. | 341/67 |
| 5,032,838 | 7/1991 | Murrayama et al. | 341/67 |

OTHER PUBLICATIONS

M. Wells, The Computer Journal, vol. 15, No. 4, 1972, "File Compression Using Variable Length Encodings", pp. 308-313.
M. Sun et al., Proc. of SPIE Applications of Digital Image Proc., vol. 1153, "High-Speed Programmable ICs for Decoding ... " pp. 28-39, 1989.
K. Yang et al., Proc. of SPIE Visual Comm. & Image Processing, 1990, vol. 1360 "Design of a Multi-Function Video Decoder ... ", pp. 1530-1539.

*Primary Examiner*—Sharon D. Logan
*Attorney, Agent, or Firm*—Gregory C. Ranieri

[57] ABSTRACT

Efficient decoding of an hierarchical, variable length, encoded data sequence containing embedded uncoded data into a sequence of fixed length instructions for subsequent processing by a digital video processor or the like is realized in an apparatus including a decoder having a plurality of variable length code decoding elements and a control structure embedded within each decoding element for transferring the decoding operation to an appropriate one of the decoding elements in response to a prior output from the decoder element. As the encoded data sequence is processed by the apparatus, a predetermined length of the sequence is stored in a register. The control structure further responds to the encoded data sequence to initiate selection of either the predetermined length of the sequence stored in the register or a portion of the decoder output as the fixed length instruction to be output by the apparatus.

14 Claims, 8 Drawing Sheets

FIG.3

| MACROBLOCK FIELDS | | | | |
|---|---|---|---|---|
| MBTYPE | QSS | MOTION | CODED BLOCK PATTERN | COEFF DATA |
| INTRABLOCK | | | | X |
| INTRABLOCK + QUANTIZED | X | | | X |
| INTERBLOCK | | | X | X |
| INTERBLOCK + QUANTIZED | X | | X | X |
| MOTION COMPENSATED + CODED + QUANTIZED | X | X | X | X |
| MOTION COMPENSATED + CODED | | X | X | X |
| MOTION COMPENSATED (NOT CODED) | | X | | |

HIERARCHICAL VARIABLE LENGTH DECODER FOR DIGITAL VIDEO DATA

TECHNICAL FIELD

This invention relates to decoders for digital signals and, more particularly, to decoders for digital video signals.

BACKGROUND OF THE INVENTION

Compressed still images and compressed motion video utilizing novel digital display and processing technology are creating new opportunities in a wide variety of fields such as computer based video telephony and video conferencing, computer based instruction and entertainment and computer based mutimedia presentations to support advertising and point of sale applications. Raw or uncompressed digital video is unsuitable for these applications because of the extensive storage and communication bandwidth required. Estimates show that storage requirements are up to 1 Mbyte per image and communication bandwidth can be up to 100 Mbps. Still image and video compression significantly reduces the number of bits required to represent an image or video sequence by taking advantage of spatial and temporal redundancies in the images and also by taking advantage of the limitations of the human eye to perceive certain forms of distortion. Compression factors ranging from 2:1 up to over 1000:1 can be achieved depending on the application and the image quality required.

In order to obtain a certain degree of uniformity in this field, standards are being adopted for the presentation of compressed digitized video information. These standards present at least three approaches for formatting different types of digital data extracted and encoded from still and moving video images. For example, P*64K (CCITT Standard H.261) covers the presentation of video telephony data, MPEG (ISO) covers the presentation of still and moving image video data for CD-ROM applications, and JPEG (ISO) covers the presentation of video data for still picture storage and transmission. Digitized video data formatted in compliance with any of the standards comprises sequences of raw data interleaved with variable length encoded data. Interleaving occurs at intervals which appear random and are a function of the underlying data. Data block lengths can vary over a wide range. As a result, recovery of fixed length data sequences and reconstruction of the video images is a problem because one cannot locate with certainty the beginning of a raw (non-coded) data word or a coded data word until the prior variable length encoded data word is fully decoded.

Data recovery and image reconstruction are further complicated by the individual data structures which make up the formatted video image data. According to the P*64K standard for video telephony data, digitized video data are divided into categories for intraframe data, interframe data, and motion compensated data, with each category being classified into subcategories of quantized, unquantized, encoded, and not encoded data. Such an arrangement of data is said to be hierarchical. Each category of data is encoded with respect to a particular set of rules optimized for the particular category of data. For data recovery, data must not only be decoded correctly, but the context or category within which the data appear in the format must also be accurately determined in order to apply the correct decoding rules. Some data, which is received and decoded, provides the key to recovering subsequent data sequences. As a result, decoding of hierarchical data is context dependent.

For hierarchical data, decoding complexity is further increased because it is necessary to keep track of the position in the hierarchy. The decoding rules applied to one set of data in one position in the hierarchy can be very different from the rules applied to a subsequent set of data in the same block simply because the position in the hierarchy and, therefore, the context may have changed.

For recovering a fixed length video data sequence from the hierarchical data, variable length decoding is the most time consuming operation. It is well known that the bit level decoding decisions can be represented as branches on a tree in which intermediate nodes represent partially decoded data and leaf nodes represent a fully decoded data symbol. See, for example, a technical article by M. Wells in *The Computer Journal*, Vol. 15, No. 4, pp. 308-313 (1972). A simple Finite State Machine, using for example a ROM and a next state register, can be used to efficiently implement this variable length decoding decision tree. For this implementation, the decoder always returns to the origin or root node of the tree after successfully decoding an individual data symbol. Bit parallel entropy decoding, in which N bits of the input sequence (where N is sufficient to contain the longest variable length code) are applied in parallel to a lookup table, has been used to increase the decoding speed above performance constraints set by hardware technology such as CMOS VLSI circuits. But this bit parallel decoding technique requires additional circuitry, for example, high speed barrel shifters and large PLAs, which makes the implementation complex and somewhat inefficient. See, Sun et al., "High-Speed Programmable ICs for Decoding Variable-Length Codes", *Proceedings of SPIE Applications of Digital Image Processing* Vol. 1153, (1989) pp. 28-39. Word parallel entropy decoding, where two or more substantially identical decoders are employed, has also been proposed to increase decoding speed. In the three examples cited above, the decoders interpret the variable length data according to a single code book or decoding tree network.

In contrast for decoding the hierarchical data, it is necessary to decode one set of symbols in order to determine which code book or decoding tree network is needed to decode the next variable length sequence. When one symbol has been decoded, the decoding process must advance to a new point (context) in the decoding hierarchy according to data obtained during the decoding of the prior individual data symbol. Moreover, the decoding process must have sufficient flexibility to handle embedded non-coded data words. One such multi-function decoder was proposed in a technical article by Yang et al., *Proc. of SPIE:, Visual Communication and Image Processing* Vol. 1360, pp. 1530 et seq. (1990). In the reported decoder, the parallel entropy decoder described and cited above performs variable length decoding on fixed length input words while a plurality of different hardware modules are called upon to decode the hierarchical aspects of the incoming data words. The fixed length is the maximum length input codeword expected by any of the variable length decoders used for the hierarchical decoding process. Each decoder effectively performs a table look-up routine in the plurality of hardware modules with the fixed length input word to output a decoded word and the total number of bits used from the input word to obtain the decoded output word. The barrel shifter in the parallel decoder shifts out N bits of the input word before proceeding with the decoding process, wherein N corresponds to the total number of bits as output from the hardware modules. A de-formatting switch, implemented as a separate finite state machine is used to maintain context, select the appropriate hardware decoding module and switch data between the various modules. By implementing the required decoders as separate hardware modules and by requiring input words having, on average, more bits than are necessary to accurately decode a unique output word, this decoder implementation is complex and somewhat inefficient. Moreover, the decoder lacks the capability to decode incoming data on a bit-by-bit basis.

It should be noted that existing decoder implementations lack sufficient simplicity, speed or functionality to perform the necessary processing for decoding hierarchical data according to any of the standard formats cited above. As a result, realization of a simple decoder with the performance required to meet the intended applications, according to any one of the standards, has yet to be successfully addressed in the published literature.

SUMMARY OF THE INVENTION

Efficient decoding of an hierarchical, variable length, encoded data sequence containing embedded uncoded data into a sequence of fixed length instructions for subsequent processing by a digital video processor or the like is realized in a seamless manner by an apparatus including a decoder having a plurality of variable length code decoding elements and a control structure embedded within each decoding element for transferring the decoding operation to an appropriate one of the decoding elements in response to a prior output from the decoder element. As the encoded data sequence is processed by the apparatus, a predetermined length of the sequence is stored in a register. The control structure further responds to the encoded data sequence to initiate selection of either the predetermined length of the sequence stored in the register or a portion of the decoder output as the fixed length instruction to be output by the apparatus.

The apparatus is programmably adaptable to handle and decode hierarchical, variable length, encoded data sequences constructed according to any standard or desired format. One exemplary embodiment shows the apparatus as a finite state machine programmed into a memory device wherein the finite state machine represents a single complex decoder providing decoded data output as various states in the finite state machine are entered in response to the individual bits in the input sequence.

Another embodiment utilizes peripheral switching or multiplexing hardware in conjunction with the memory to conserve memory usage.

BRIEF DESCRIPTION OF THE DRAWING

A more complete understanding of the invention may be obtained by reading the following description of specific illustrative embodiments of the invention in conjunction with the appended drawing in which:

FIG. 3 is a table showing the relationship between macroblock type and the associated macroblock fields for the exemplary format of FIG. 2;

DETAILED DESCRIPTION

Video data are generally subjected to two forms of data compression, namely, data compaction and entropy encoding. Data compaction removes redundancy through techniques involving motion compensated frame differences and discrete cosine transform methods. Entropy encoding keeps the average number of bits per symbol required to encode messages from the source at a minimum. In current video encoding systems, Huffman encoding and run length encoding are examples of two variable length entropy encoding techniques employed on compacted data.

Figure 1:
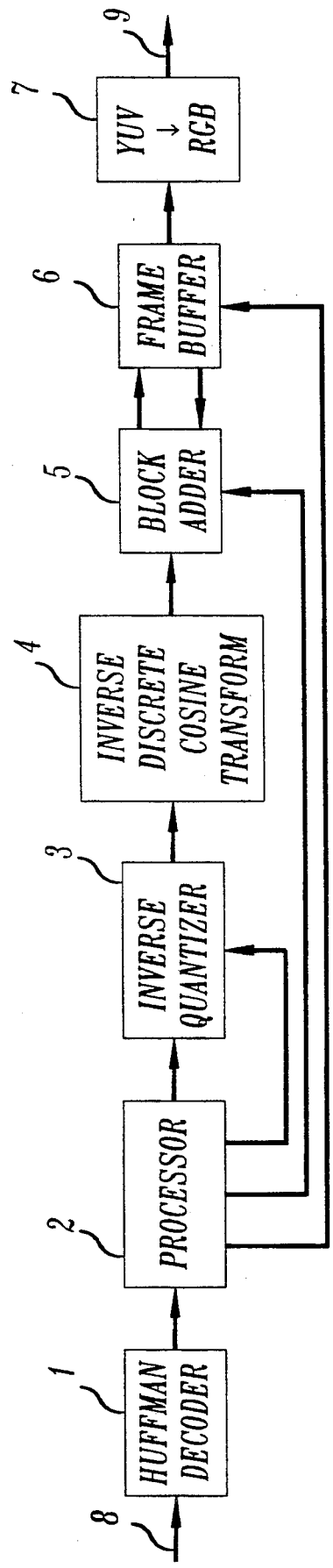
FIG. 1 is a simplified block diagram of a video decoding system.

When encoded data are received at a video decoding terminal, image reconstruction is performed by a sequence of processing steps similar to those shown in FIG. 1. The exemplary processing steps shown in FIG. 1 are for full motion video image reconstruction according to the CCITT (H.261) P*64K standard when the encoded data follows the exemplary frame format shown in FIG. 2.

As shown in FIG. 1, an hierarchical, variable length, encoded sequence 8 is input to an entropy decoder such as Huffman decoder 1 for conversion into a sequence of fixed length instructions comprising control data and discrete cosine transform data. Entropy decoding is understood to encompass various decoding techniques such as variable length techniques including Huffman codes and run-length codes and the like. Therefore, subsequent references to Huffman decoding or Huffman decoders are intended to be for purposes of illustration and not for purposes of limitation. Processor 2 accepts the fixed length instructions and routes various instructions to certain processing elements. For example, quantizer step size instructions are sent to inverse quantizer 3, block type instructions are sent to block adder 5, and motion vector instructions are sent to frame buffer 6. Processor 2 also operates on other instructions in order to complete data blocks which were either omitted from or only partially sent in sequence 8. Inverse quantization is then applied to the data sequence traversing inverse quantizer 3. After inverse quantization, the sequence is passed through inverse discrete cosine transform 4 to produce pixel blocks. In block adder 5 and frame buffer 6, the pixel blocks are manipulated using the motion vector instruction and the block type instruction to construct the new video frame from the previous video frame. Processing element 7 converts the new video frame luminance and chrominance (YUV) information into red-green-blue (RGB) information for display on a monitor or the like.

The present invention is concerned with those aspects of the entropy decoder, that is, exemplary Huffman decoder 1, which permit efficient decoding of hierarchical variable length, encoded data sequences into a stream of fixed length instructions. Even though the concept of an hierarchical, variable length, encoded data sequence has been introduced above, it is thought to be instructive to view one such exemplary sequence. The exemplary sequence is taken from the CCITT P*64K standard and is shown in simplified form in FIGS. 2 and 3.

Figure 2:
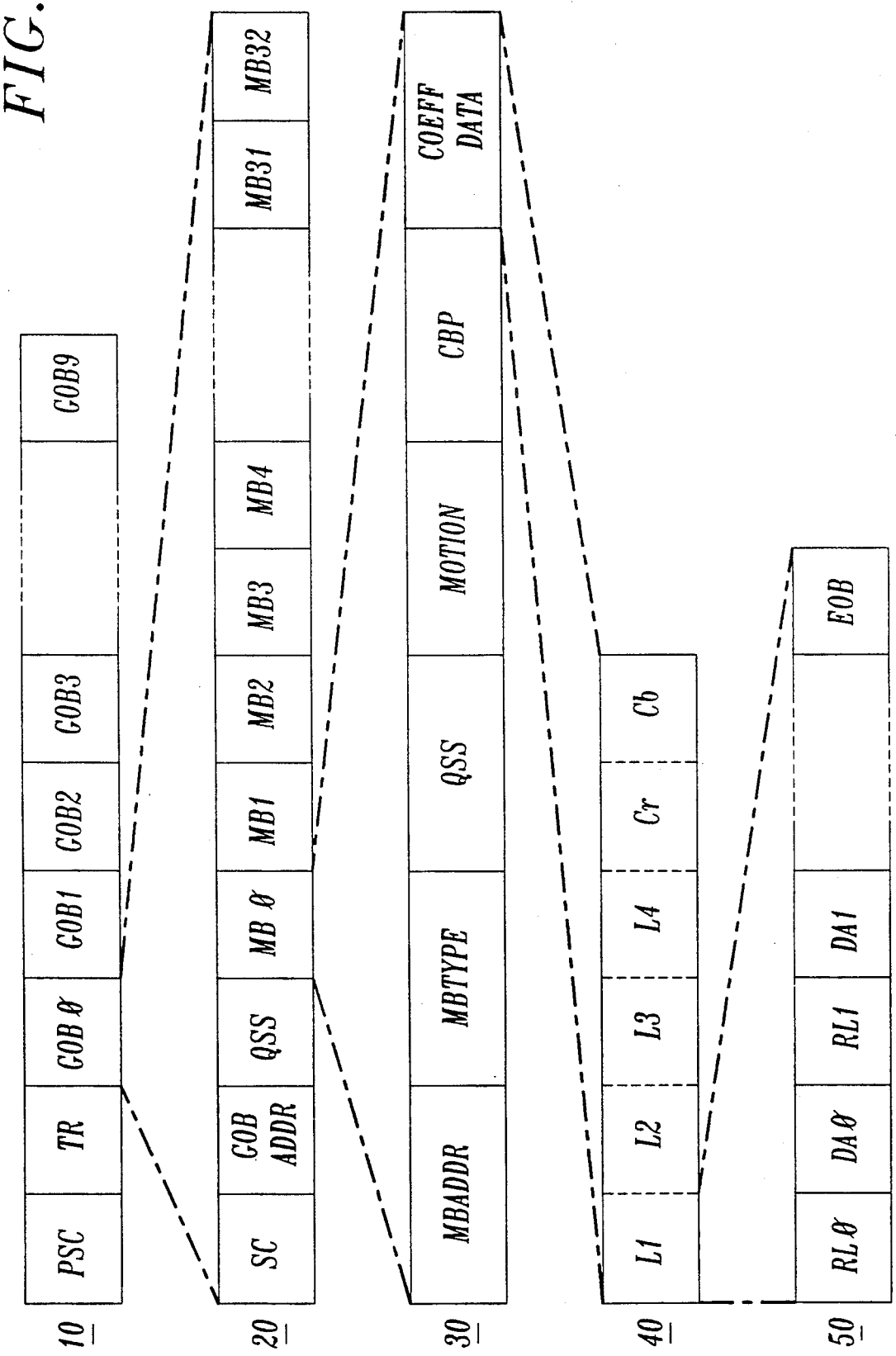
FIG. 2 shows an exemplary frame format for hierarchical encoded video data according to the CCITT standard.

As shown in FIG. 2, the hierarchical, variable length, encoded sequence for one frame according to the P*64K standard is arranged in a five layer structure. The layer structure is subdivided into frame layer 10, group of blocks layer 20, macroblocks layer 30, block layer 40, and coefficient layer 50.

Frame layer 10 comprises a twenty bit starting code (PSC), a five bit temporal reference code (TR), and group of blocks data. Starting code PSC is generally used to initialize the decoding process. Group of blocks data GOB0 through GOB9 provides full video frame coverage as the group of blocks are arranged in 5×2 matrix form as shown below:

| Frame | |
|---|---|
| GOB0 | GOB1 |
| GOB2 | GOB3 |
| GOB4 | GOB5 |
| GOB6 | GOB7 |
| GOB8 | GOB9 |

In group of blocks layer 20, each group of blocks data comprises a sixteen bit start code (SC), a group of blocks address (GOB ADDR), a five bit quantizer step size (QSS), and macroblocks data. The macroblocks data consists of thirty three macroblocks MB0 through MB32 which are arranged within a particular group of blocks in 3×11 matrix form as follows:

| Group of Blocks | | | | | | | | | | |
|---|---|---|---|---|---|---|---|---|---|---|
| MB0 | MB1 | MB2 | MB3 | MB4 | MB5 | MB6 | MB7 | MB8 | MB9 | MB10 |
| MB11 | MB12 | MB13 | MB14 | MB15 | MB16 | MB17 | MB18 | MB19 | MB20 | MB21 |
| MB22 | MB23 | MB24 | MB25 | MB26 | MB27 | MB28 | MB29 | MB30 | MB31 | MB32 |

For macroblocks layer 30, each macroblock consists of a variable length encoded macroblock address (MB ADDR or FIXRUN), a variable length encoded macroblock type (MB TYPE), and, depending upon the macroblock type, one or all of the following: a five bit quantizer step size (QSS), a variable length encoded motion vector (MOTION), a variable length encoded coefficient block pattern (CBP), and coefficient data. Each macroblock relates to blocks of coefficient data for a particular section of a frame covering 16 lines by 16 pixels of luminance information and the spatially corresponding 8 lines by 8 pixels of chrominance information, that is, each of Cr and Cb.

The variable length encoded macroblock address includes information concerning the number of macroblocks for which no information is sent and the address of the macroblock for which data are sent. Macroblocks for which no information is sent are called fixed blocks.

Macroblocks are classified in the exemplary format according to the type of information being included in the macroblock. There are seven different classifications for macroblock data: intrablock; intrablock and quantizer; interblock; interblock and quantizer; motion compensated, coded and quantizer; motion compensated and coded; and motion compensated but not coded. As stated above and shown in table form in FIG. 3, for each macroblock type (MB TYPE) sent, there are different combinations of information sent for the representative macroblocks. For example, intrablock and quantized macroblock type requires that the quantizer step size (QSS) be included in the macroblock with coefficient data. Each "x" in FIG. 3 indicates the presence of data in that word or field of the macroblock.

It is instructive to understand the definition of each macroblock type for the exemplary P*64K standard. Intrablock refers to a macroblock which is sent independent of information sent in the past. Coefficients for the four luminance and two chrominance are all sent for each macroblock of the intrablock type. For macroblocks of the intrablock and quantizer type, a revised quantizer step size is sent in addition to the chrominance and luminance data. The revised quantizer step size is needed to achieve both sufficient resolution of the accompanying coefficient data and the required number of coded bits per frame.

Motion compensated block types are included in a macroblock when a close match is found between the block in the current frame and an other block in a previous frame wherein the other block is displaced by a fixed amount from the block in the current frame. When the differences between the block in the current frame and the block in the previous frame are large, then the difference information is sent in the macroblock. This type of macroblock is classified as motion compensated and coded. When differences between the block in the current frame and the block from a previous frame are small, the motion vector is included in the macroblock without accompanying coefficient data. The latter type of macroblock is classified as motion compensated and not coded.

An interblock type of macroblock is one which is used when the block in the current frame most closely matches the same block in the previous frame, but the difference is large enough to require coding. That is, interblock refers to a motion compensated and coded block having a motion vector set to zero. The fixed block type of macroblock (not shown in FIG. 3) is used when the block in the current frame most closely matches the same block in the previous frame and the difference between these blocks is not large enough to require coding. A fixed block type is not sent explicitly but is implied for all macroblocks for which no information is sent.

Variable length encoded motion vector (MOTION) includes the Cartesian coordinates (x,y) representing the displacement of the reference macroblock from the previous frame. Variable length encoded block pattern (CBP) is present for all coded blocks except intrablocks to give a pattern indicative of which of the six blocks of discrete cosine transform coefficients (L1 through L4, Cr, Cb) are included in the macroblock.

Block layer 40 includes some or all of the coefficient data blocks, based upon both the variable length encoded macroblock type and the variable length encoded block pattern. Coefficient data blocks are four luminance blocks (L1, L2, L3, and L4) and two chrominance blocks (Cr and Cb). Since the macroblock corresponds to an area of 16 lines by 16 pixels, each luminance coefficient block represents an 8 line by 8 pixel area where the luminance blocks are arranged in a 2×2 matrix format as follows:

| Macroblock | |
|---|---|
| L1 | L2 |
| L3 | L4 | and the chrominance or color difference blocks are each representative of the corresponding 16 line by 16 pixel area for that macroblock, subsampled by a factor two in both the x and y directions.

Coefficient layer 50 includes variable length encoded data interspersed with raw data for each of the luminance and chrominance blocks. For example, the beginning portion of a luminance block is a variable length encoded word RLO which specifies how many zeros of raw data are to be inserted before reading the next variable length uncoded coefficient, data word DAO, and how many bits are to be associated with that coefficient. This interspersing of variable length encoded data with raw (uncoded) data continues until the end of the block. A special value of the RL variable length code is used to denote the end of the coefficient block (EOB).

From the description above and the related FIGS. 2 and 3, it should be clear that the exemplary hierarchical, variable length, encoded data sequence and any other such sequence is a complicated sequence to decode. The complexity arises for a number of reasons such as that: portions of the sequence are variable length encoded data while other portions of the sequence are fixed length (not coded) data fields; these portions are interleaved with one another; each different portion of variable length encoded data requires a different decoder to be used; and subsequent decoding or raw data recovery activities are dependent upon the particular data already received. Context dependence of the data is easily grasped when one views the effect of receiving a macroblock of one type, for example, intrablock followed by another macroblock of a different type, for example, motion compensated but not coded. In this example, the decoding process for the intrablock information is different from the decoding process for the motion compensated information. Moreover, coefficient data is expected for the intrablock macroblock whereas coefficient data is not expected for the particular type of motion compensated macroblock. Even within a macroblock, context dependence is understood from viewing the additional constraints placed on the macroblock information by the block pattern. Without proper recovery of each and every portion of the hierarchical sequence, the image cannot be accurately recovered and reconstructed.

Figure 4:
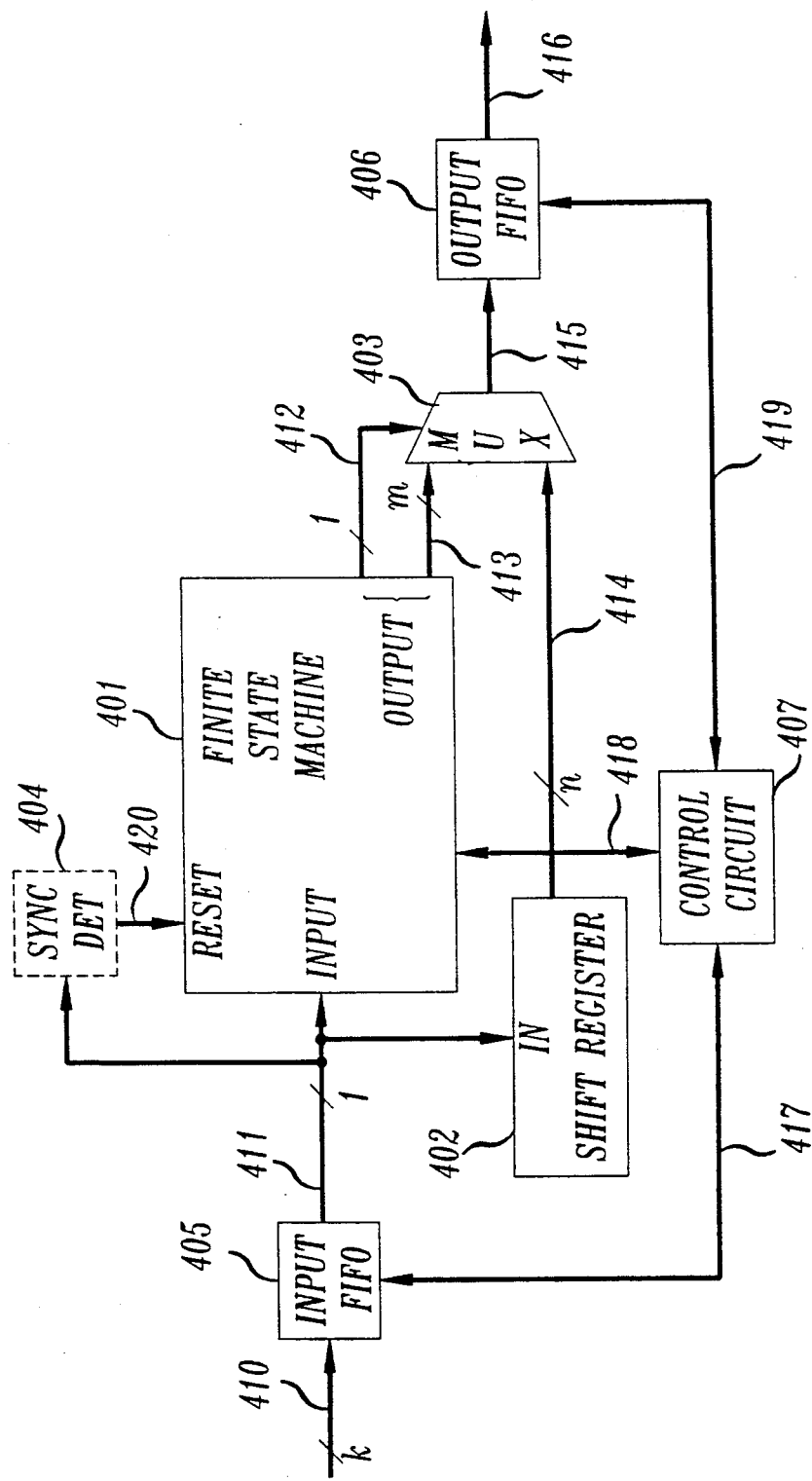
FIGS. 4, 5, and 8 are simplified block diagrams for decoder apparatus realized in accordance with the principles of the invention.
Figure 5:
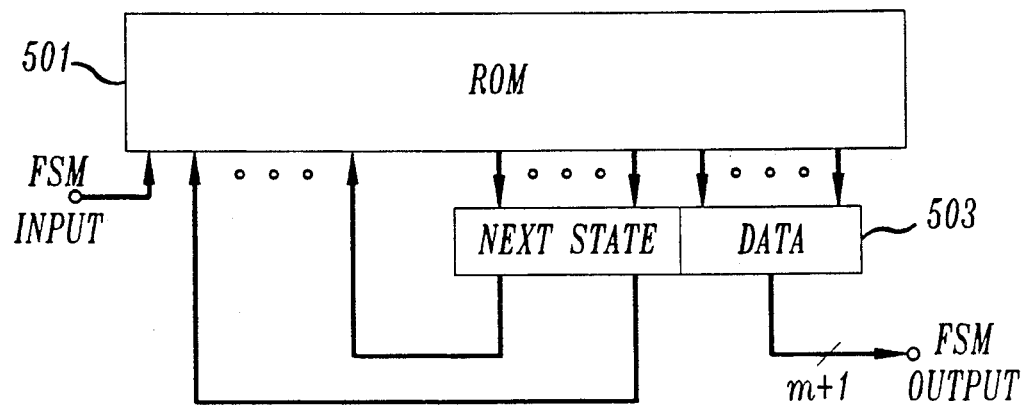
Figure 8:
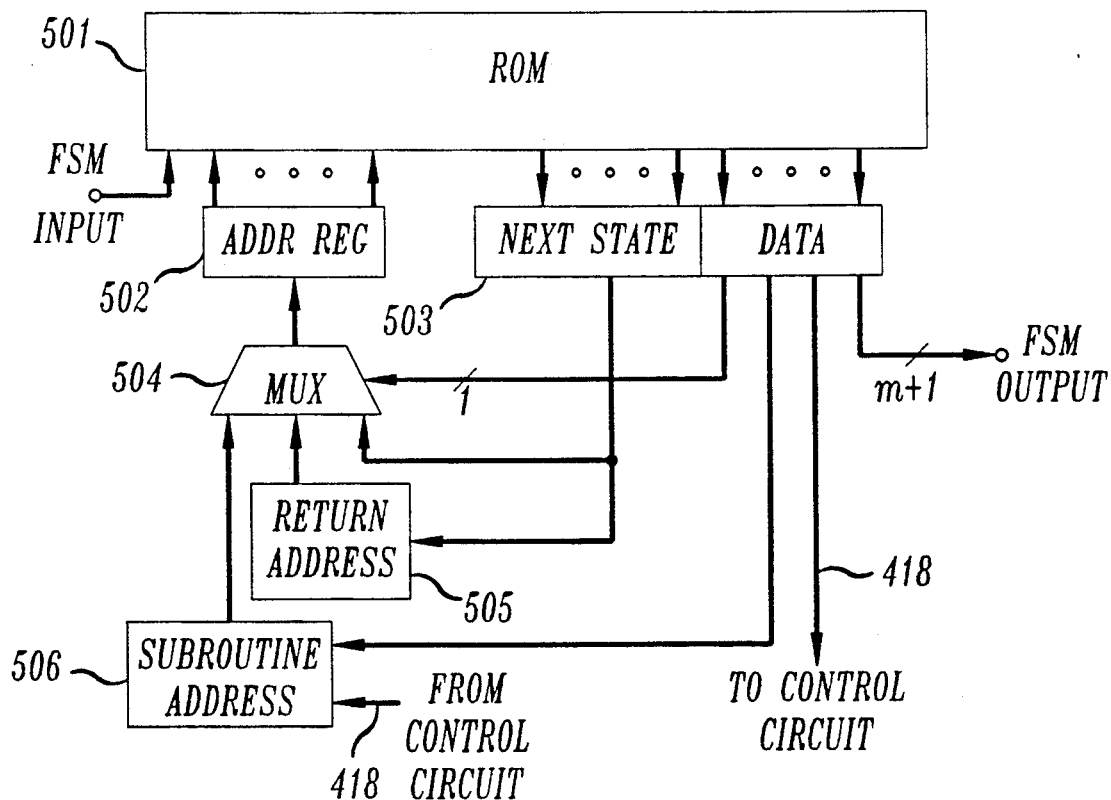

Decoder apparatus is shown in an exemplary embodiment in FIG. 4 with additional details of exemplary finite state machine realization in FIGS. 5 and 8. The decoder apparatus includes finite state machine 401, shift register 402 and multiplexer 403 together with input first-in, first-out (FIFO) buffer 405 and output FIFO buffer 406. Optional synchronization detector 404 is shown connected to finite state machine 401. Control circuit 407 communicates with FIFOs 405 and 406 and finite state machine 401. One convention adopted in simplifying the FIGURES has been to show the number of data paths or output lines as a slash through a single path or line in combination with a number or variable. As a further simplification of the drawing, conventional read/write and clock or clock-related signals have been omitted from the figures but are well understood by those skilled in the art.

Hierarchical, variable length, encoded sequences are input to the decoder apparatus in parallel form via lead 410. Lead 410 comprises k parallel lines for providing data in parallel to input FIFO 405. Input FIFO 405 converts the parallel data into a serial bit stream which is supplied to finite state machine 401 via lead 411. Input and output control of input FIFO 405 is carried out by control circuit 407 as described in more detail below.

Input FIFO 405 provides parallel-to-serial conversion of the data sequence, if necessary, and acts as an elastic storage device to provide data to the finite state machine at a more nearly uniform rate which is determined by clocking and other control of the finite state machine. Parallel input of the data sequence occurs when the communication network or storage device connected to the decoding apparatus provides segments of the data sequence such as K-bit words or bytes. In the event that the data sequence is provided as a constant rate serial bit stream from the communication network or storage medium, input FIFO 405 would provide elastic storage or would be omitted entirely.

The serial data sequence on lead 411 is simultaneously input to shift register 402, finite state machine 401, and synchronization detector 404. Shift register 402 has a capacity for storing at least the most recent n bits of the variable length, encoded data sequence. As shown in FIG. 4, output of shift register 402 is made along n parallel lines shown as lead 414. The n bit output from shift register 402 is applied to multiplexer 403 where n is generally related to the word length of the fixed length instructions on lead 416.

Finite state machine 401 receives each bit of the data sequence on lead 411. Machine 401 advances from a prior state to one of the new states in response to the most recent bit of the data sequence received by the finite state machine. States of finite state machine 401 relate to operations which are to be performed by the machine in response to received data. For example, when variable length, encoded data are received, finite state machine 401 enters and proceeds through those states necessary to successfully decode the data into an m-bit output symbol. When uncoded data embedded in the hierarchical data sequence are received, finite state machine 401 enters and proceeds through those states which effectively permit the correct number of bits to be accumulated in shift register 402. Upon reaching the state which indicates completion of either of the events described above, finite state machine 401 provides a control instruction and an m-bit output symbol to multiplexer 403. A portion of the control instruction is shown on lead 412 as a single bit line whereas the output symbol is shown on m parallel lines of lead 413. The remaining portion of the control instruction is passed on lead 418 to control circuit 407 to permit the control circuit to manage the operation of input FIFO 405 and output FIFO 406 as well as the subsequent operation of finite state machine 401, if necessary. While only one lead is shown for the control instruction, it is understood that the control instruction may include more than one bit to signify that the decoding of a symbol is completed and that the symbol should be taken from either the finite state machine or from the shift register.

In response to the control instruction on lead 412, multiplexer 403 selects one of its two inputs as its output on lead 415. When the finite state machine has completed decoding the data sequence into an output symbol, the control instruction applied to multiplexer 403 causes the output symbol on lead 413 to be selected and output from the multiplexer on lead 415. Alternatively, when an uncoded word is completely received and resident in shift register 402, finite state machine 401 outputs a control instruction to multiplexer 403 causing the uncoded word to be selected by the multiplexer for output on lead 415.

Output FIFO 406 receives the output from multiplexer 403 and, under control of circuit 407, provides an output on lead 416. For the system shown in FIG. 1, lead 416 corresponds to the output from entropy (Huffman) decoder 1 which is supplied to processor 2. Since the data from finite state machine 401 or shift register 402 is output through multiplexer 403 at irregular intervals, output FIFO 406 provides the necessary buffering and elastic storage to supply fixed length instructions to succeeding system elements at a desired rate.

Control circuit 407 manages the writing of data to output FIFO 406, the reading of data from input FIFO 405, and the operation of finite state machine 401 including writing data to and reading data from finite state machine 401. Also, control circuit 407 may control shift operations of register 402 and selection of output information by multiplexer 403. The particular action taken by control circuit 407 is generally related to conditions existing in either FIFO 405 or FIFO 406. Such conditions include overflow of FIFO 406 and underflow of FIFO 405 and the like. For example, when there is an underflow of FIFO 405, that is, when there is no data in FIFO 405 to be supplied to machine 401, control circuit 407 senses the underflow condition and immediately halts the operation of finite state machine 401.

Synchronization detector 404 is an optional element for the decoding apparatus. It is generally used to initialize finite state machine to a known state. When errors occur in the encoded data sequence on lead 411 causing the finite state machine to lose context, synchronization detector 404 resynchronizes finite state machine 401 when it detects a known code word in the sequence on lead 411. For example, for a machine decoding the P*64K hierarchical codes shown in FIG. 2, the PSC code word could be recognized by the synchronization detector and used to reset the finite state machine to a known state at the beginning of each frame via the reset port of finite state machine 401.

Finite state machine 401 is realized using known hardware, firmware and software elements arranged in accordance with the principles of the present invention to perform the logical operations of decoding an hierarchical, variable length, encoded data sequence. Variable length encoding and decoding techniques and apparatus are described in technical references such as the technical article by M. Wells cited above, a technical article by D. Huffman in *Proc. IRE*, Vol. 40, pp. 1098-1101 (1962), and U.S. Pat. No. 3,918,047, all of which are incorporated herein expressly by reference.

One exemplary embodiment of finite state machine 401 is shown in simplified block diagram form in FIG. 5. As shown in FIG. 5, exemplary finite state machine 401 includes read-only memory 501 and output latch or register 503. Output register 503 comprises a NEXT STATE partial address and DATA register. The NEXT STATE partial address includes the $j-1$ most significant bits of the address for the next state of the finite state machine stored in the memory. The NEXT STATE partial address is supplied to the addressing port of the memory. Hierarchical, encoded data are supplied to the least significant position of the addressing port for ROM 501. The DATA register includes control instructions and output symbols decoded by the finite state machine realized in the memory.

Read-only-memory 501 (ROM) provides the basic functionality for finite state machine 401. ROM 501 is either programmable or interchangeable with similar memory modules to provide decoding of the wide variety of standard hierarchical, variable length, encoded sequence formats such as MPEG, JPEG, P*64K and the like. The operation of ROM 501 is synchronized with the incoming hierarchical data appearing at the input terminal FSM INPUT. That is, address information is read into ROM 501 and contents are read out of ROM 501 into register 503 in synchronism with the data clock signal or read/write signal which have been omitted from the drawing but are understood by those skilled in the art. Such signals may be supplied by control circuit 407. The clock signal source and interconnections of the clock signal and control circuit 407 to elements of the decoder apparatus have been omitted from the FIGURES and are well understood by those persons skilled in the art. Register 503 latches the output from the ROM so that the output remains stable for addressing and output purposes. If the ROM can provide a latched output on its own, then register 503 may be omitted.

In order to decode hierarchical, variable length encoded data sequences in accordance with the principles of this invention, it is necessary to program the operations of the finite state machine and, therefore, the decoding tree networks into ROM 501. For binary sequences, each state permits transition to either of two succeeding states. For entropy decoders based on a single (i.e., non-hierarchical) decoding tree network, the programming of a finite state machine is known. See, for example, the decoding tree network described in U.S. Pat. No. 3,918,047 cited above. This is accomplished in an exemplary embodiment by storing partial address information in the memory location associated with a particular state wherein the partial address information are the $j-1$ most significant bits of the $j$ bit addresses for the next two succeeding states. When the next data bit of the hierarchical data sequence is received, it is concatenated in the least significant position with the $j-1$ bits of the partial address to form the complete address of the next state.

Since an hierarchical encoded data sequence includes a plurality of variable length code words requiring different types of decoding tree networks based upon the information previously received in the hierarchical data sequence, the state in our invention is used to indicate both the progress in decoding the current variable length, input word and the context within which the word is being received. During a variable length decoding operation, the partial address indicates the two next states (for binary data) in the decoding process. The actual next state chosen for decoding depends upon the value of the next input data bit. When decoding is complete, the partial address indicates the two first states in the next decoding tree network according to the particular hierarchical decoding strategy being implemented. The actual first state chosen depends on the value of the next input data bit, this being the first encoded bit of the new variable length, encoded data word.

When decoding is complete, the contents in the DATA portion of register 503 include the m-bit decoded symbol as well as control information, shown as a single bit output at FSM OUTPUT, which indicates completion of decoding. For hierarchical sequences which include embedded raw data, additional control information may be output to register 503 to indicate that a fixed length non-coded (raw) data word has been completely received, is resident is shift register 402, and should be selected by multiplexer 403. See lead 412 in FIG. 4.

In order to reset the finite state machine to a predetermined state, it is desirable to force the address input to the address port of the ROM to be a known predetermined address which overrides the partial address from register 503. Such an override is provided by sync detection 404 on lead 420.

Figure 6:
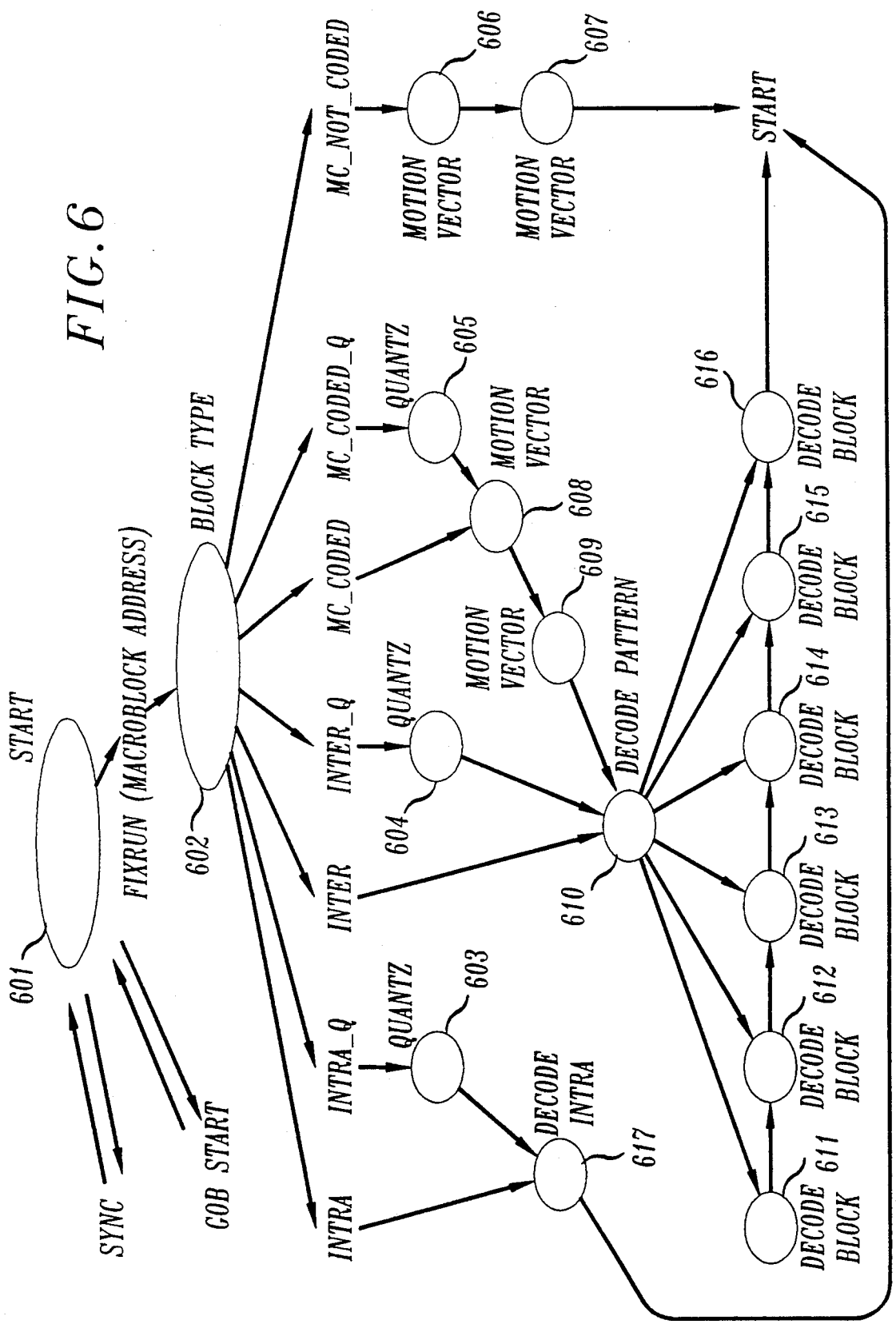
FIGS. 6, 7, and 9 are simplified decoding context and state diagrams for an exemplary hierarchical, variable length, encoded sequence.

A context diagram of an exemplary decoder for the P*64k standard hierarchical data sequences is shown in FIG. 6. Contexts are indicated as ovals and the directed flow from context to context is depicted by arrows. The decoder processes the header information in the frame format of FIG. 2 to the macroblock address. This processing is performed in start context 601 together with decoding of the variable length encoded macroblock address (FIXRUN). When the macroblock address has been decoded, the finite state machine enters block type context 602 which permits decoding of the macroblock type, which is also variable length encoded. Since there are seven macroblock types, the output of context 602 may be directed to any one of the seven subsequent contexts. Intrablock (INTRA) block type causes transfer to decode block context 611 whereas intrablock and quantized (INTRA_Q) block type causes transfer to quantizer context 603. Interblock (INTER) block type causes transfer to decode pattern context 610 whereas interblock and quantized (INTER_Q) causes transfer to quantizer context 604. Motion compensated and coded (MC_CODED) block type causes transfer to motion vector context 608; motion compensated, coded, and quantized (MC_CODED_Q) block type causes transfer to quantizer context 605; and motion compensated and not coded (MC_NOT_CODED) block type causes transfer to motion vector context 606. The remaining context transitions are clearly depicted in FIG. 6. At the completion of each macroblock decoding, which may itself require at least several different decoding levels, the finite state machine in memory 501 is reset to start context 601.

Figure 7:
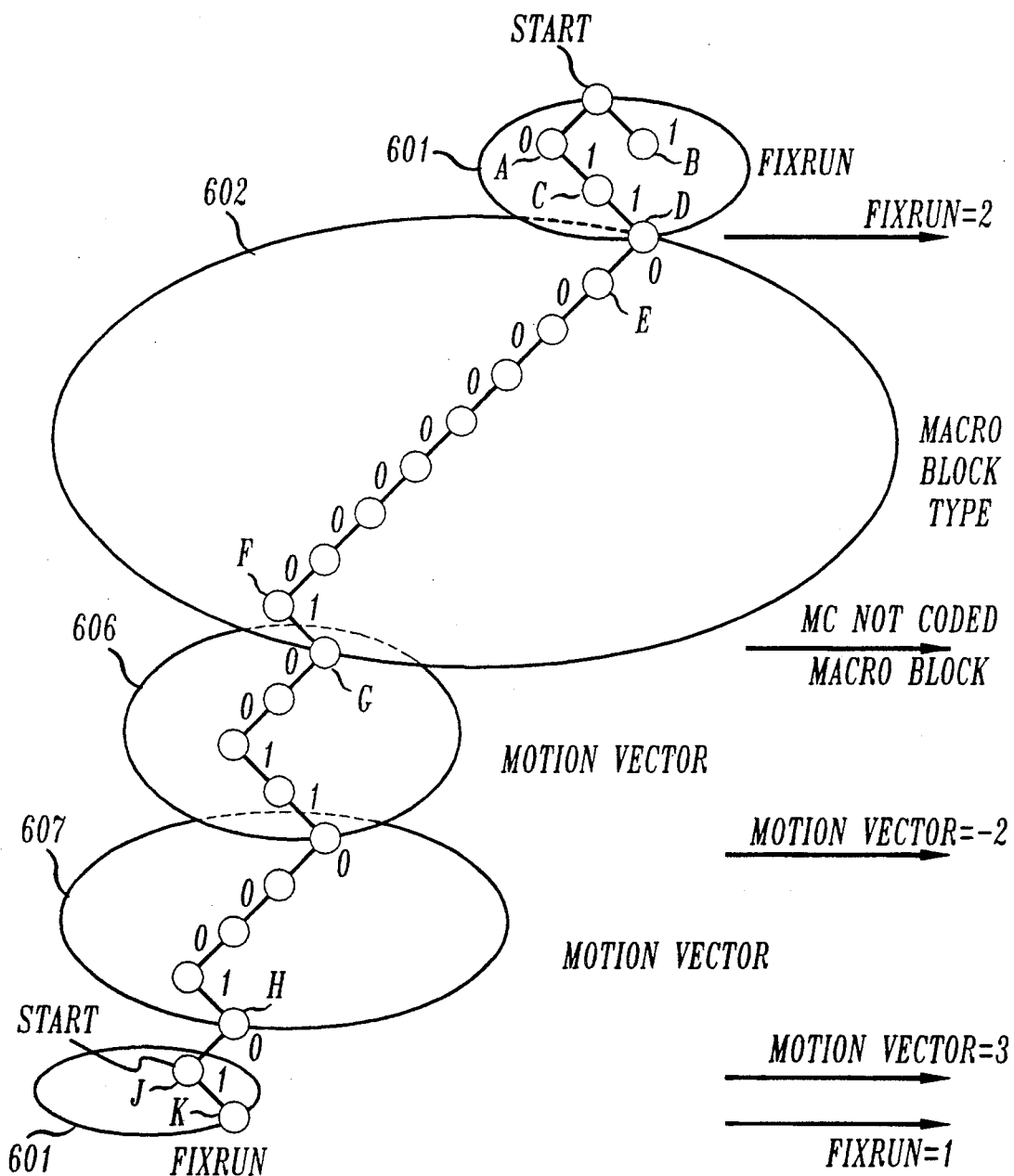

Each context represents a single (complete) decoding operation from which an output is expected. Each context, therefore, corresponds to a number of states in finite state machine 401. FIG. 7 has been provided to illustrate the decoding operation of an exemplary portion of a received hierarchical, variable length, encoded data sequence. Examination of the state transitions that occur as a result of receiving this sequence illustrates how a single integrated tree network comprising a plurality of individual decoding tree networks is used both to perform variable length decoding and to track decoding context.

The finite state machine enters START state which is part of start context 601. The first partial address in the NEXT STATE portion of register 503 from the memory location corresponding to the state labelled START is concatenated with the first input data bit, which is a "0". This causes a transition to state A rather than state B, which would require an address of a k−1 bits in the NEXT STATE portion of register 503 concatenated with a "1" input bit in the least significant address bit position. At this point, variable length decoding of the macroblock address FIXRUN is incomplete and, as a result, the DATA portion of register 503 does not contain a valid output. Control information in the DATA portion of register 503 and in the memory location corresponding to state A indicates that there is no data to be output to the multiplexer 403 from register 503. This causes the multiplexer to sit idle awaiting valid decoded data. However, the NEXT STATE partial address portion of register 503 contains the j−1 most significant bits of the j-bit memory address corresponding to state C. By concatenating the next encoded bit of the input sequence—a "1" in the example—with the contents of the NEXT STATE portion of register 503, the process of decoding the variable length encoded macroblock address continues to state C and, so on, through state D. When decoding the macroblock address has been concluded at state D, the contents of the memory location corresponding to state D are output to register 503. The NEXT STATE portion of register 503 contains the partial address (j−1 most significant bits for state E) and the DATA portion of register 503 contains the decoded output symbol indicating that FIXRUN=2. The DATA portion of register 503 also contains the control instruction indicating that decoding is complete and that the decoded symbol output for multiplexer 403 is to be taken from register 503.

Since this encoded data is hierarchical and variable length encoded, it is necessary to proceed through several more contexts in the decoder. The sequence shown causes the decoder apparatus to decode the variable length encoded macroblock type as motion compensated and not coded (MC_NOT_CODED). Now that the macroblock type corresponding to the macroblock layer in the decoding hierarchy has been determined by the most recent decoding step, the decoder's NEXT STATE partial address causes the motion vector decoding states to be entered. As the input encoded data sequence together with the various partial addresses causes the internal states of each state to be traversed, the motion vector output symbols are declared as −2 and 3. Once motion vector decoding is completed, start state in context 601 is again entered to continue with macroblock decoding. It is clear from the description in this example that for a slightly different input sequence a wholly different set of decoding states could be entered and traversed. This is the nature of a hierarchical sequence.

Figure 9:
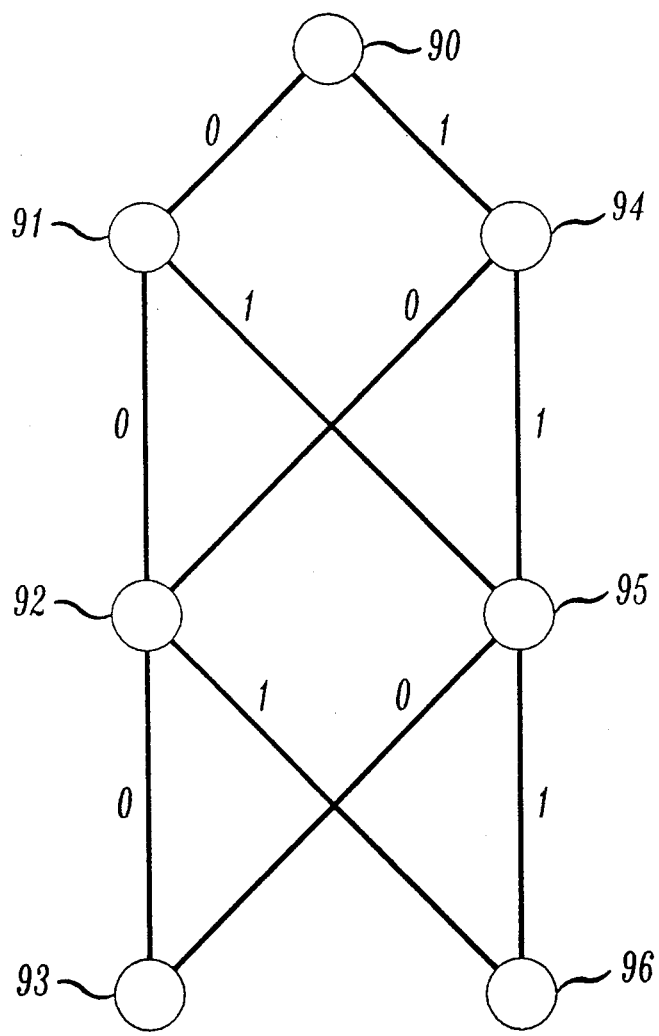

In order to accommodate non-coded data in the hierarchical data sequence, it is contemplated that the finite state machine enter a context or series of states which permits the data to be accumulated in the shift register 402 while maintaining the contextual information already received. One such element or context is shown in FIG. 9. The shift state context in FIG. 9 comprises a plurality of states emanating from an initial state for permitting the finite state machine to progress through a predetermined number of states of the cross-connected structure independent of the encoded data sequence until the proper number of bits of non-coded data are accumulated in the register external to the finite state machine. When the last state of the shift state context is reached, the FSM will either be in state 93 or state 96 depending on whether the last bit of non-coded data is a 0 or a 1. For both these states, the partial address points to the initial states of the appropriate next context in the hierarchy and the control instruction indicates that the decoding has been completed and that the output should be taken from the register 402 external to the finite state machine. The context shown in FIG. 9 allows three shift states to be traversed so that a three bit symbol can be accumulated in the external register 402. Binary zeros and ones adjacent to the branches indicate the value of the input data bit which is used as the least significant address bit for ROM addressing.

As shown in FIG. 8, exemplary finite state machine 401 includes read-only memory 501, address register 502, output register 503, data multiplexer 504, return address register 505, and subroutine address memory 506, all interconnected as shown in the FIGURE.

The implementation shown in FIG. 8 is an alternative to the one shown in FIG. 5. In FIG. 5, external control is minimized by providing all possible decoding states within ROM 501. Such an approach for the P*64 standard requires that duplicate trees for contexts such as MOTION VECTOR, DECODE BLOCK and QUANTZ are maintained in ROM 501 of FIG. 5. For the modified implementation shown in FIG. 8, the storage requirements for ROM 501 are relaxed while the complexity of the control logic is increased. A single copy of the coefficient (DECODE BLOCK) and motion vector (MOTION VECTOR) decoding trees is maintained in ROM 501 of FIG. 8. By employing the single copy of each decoding tree, it is necessary to remember where in the hierarchy the particular decoding tree was entered, that is, within the context of INTRA or INTER or the like. It is expected that the alternative implementation shown in FIG. 8 would result in a several thousand word reduction in the size of ROM 501.

Multiplexer 504 is controlled by a control instruction in the DATA portion of register 503. Multiplexer 504 selects one address for presentation to address register 502. Possible addresses chosen by multiplexer 504 are the next address which is supplied as a partial address from the NEXT STATE portion of register 503, a return pointer stored as a partial address in return address register 505, and a call pointer which is controllably supplied as a partial address from subroutine address memory 506. When supplied to address register 502, each of the partial addresses is concatenated with the incoming data bit supplied via terminal FSM INPUT.

The partial addresses stored in subroutine address memory 506 relate to the location of the first state in ROM 501 for the coefficient decoding tree and the motion vector decoding tree. A control instruction from the data portion of register 503 either separately or in conjunction with a concurrent instruction from the control circuit on lead 418 causes one of the addresses to be selected from subroutine address memory 506. Concurrent with this operation, the partial address from the NEXT STATE portion of register 503 is stored in return address register 505. At the completion of decoding via the motion vector or coefficient decoding tree, the control instruction from the data portion of register 503 to multiplexer 504 causes the partial address in return address register 505 to be loaded into address register 502. In this way, the external control logic observes the context dependent decoding of the hierarchical sequence.

While joint control of the subroutine address memory 506 is shown in FIG. 8 and while multiplexer 504 is shown to be controlled via an instruction in register 503, it is contemplated that control instructions from register 503 be interpreted by the control circuit so that the control circuit alone exercises control over either multiplexer 504 or subroutine address memory 506 or both.

While the examples contained herein describe binary decoding trees primarily directed toward decoding binary data, it should be clear to those skilled in the art that this invention is applicable to higher order decoding trees (e.g., quaternary trees) used to decode multilevel symbols represented by groups of bits, bytes, or the like. Moreover, entropy decoding methods including variable length decoding techniques such as Huffman decoding, run-length decoding, and the like are contemplated for use herein.

We claim:

1. Apparatus for converting an hierarchical, variable length, encoded data sequence into fixed length output instructions, the apparatus comprising
    means for storing a fixed length of the encoded data sequence,
    means for decoding, according to one of a plurality of variable length, decoding tree networks, a sufficient portion of the encoded data sequence to generate an output symbol, a control instruction, and a selection instruction,
    means responsive to the control instruction for selecting an output from the group consisting of the fixed length of the encoded data sequence from the storing means and the output symbol from the decoding means, said output being a fixed length output instruction, and
    means for changing from the one variable length, decoding tree network to another variable length, decoding tree network in said decoding means in response to the selection instruction from the decoding means.

2. The apparatus as defined in claim 1 wherein the changing means further includes means responsive to predetermined data pattern in the encoded data sequence for initializing the decoding means to a predetermined variable length, decoding tree network.

3. The apparatus as defined in claim 1 further including an input FIFO memory means for receiving said encoded data sequence and for outputting the encoded data sequence serially to the storing means and to the decoding means.

4. The apparatus as defined in claim 1 further including an output FIFO memory means for receiving each of said output instructions and for outputting the output instruction in a parallel manner.

5. The apparatus as defined in claim 3 further including an output FIFO memory means for receiving each of said output instructions and for outputting the output instruction in a parallel manner.

6. The apparatus as defined in claim 5 further including means for controlling reading and writing operations in the input FIFO memory means and the output FIFO memory means, respectively.

7. The apparatus as defined in claim 1 wherein the means for decoding includes a read-only memory.

8. Apparatus for converting an hierarchical, variable length, encoded data sequence into a plurality of fixed length output instructions, the apparatus comprising
    means for decoding, according to one of a plurality of variable length, decoding tree networks, a sufficient portion of the encoded data sequence to generate an output symbol and a selection instruction, and means embedded in each said variable length, decoding tree network for changing from the one variable length, decoding tree network to another variable length, decoding tree network in said decoding means in response to the selection instruction from the decoding means.

9. An arrangement for decoding an hierarchical, variable length, encoded symbol sequence into a sequence of fixed length instructions, the arrangement comprising:
- a plurality of individually addressable decoding means, each including a plurality of addressable decoding elements,
- means for concatenating a symbol from the hierarchical, variable length, encoded data sequence with a partial address to form a complete address, the complete address indicating the location of a desired decoding element;
- one of the plurality of individually addressable decoding means responsive to the complete address for retrieving contents stored in the desired decoding element wherein the contents of the desired decoding element include an indication of decoding completion by the one individually addressable decoding means, said indication having first and second states, a partial address of the next desired decoding element, the next desired decoding element being in the same one of the individually addressable decoding means as the desired decoding element when the indication is in the first state, the next desired decoding element being in a next desired one of the individually addressable decoding means when the indication is in the second state, and, when the indication of decoding completion is in the second state, a fixed length instruction.

10. The arrangement as defined in claim 9 further comprising:
- means for storing a plurality of symbols from the hierarchical, variable length, encoded data sequence and, in response to the fixed length instruction from a decoding element at a predetermined value, for substituting at least one of the plurality of stored symbols for the fixed length instruction from the desired decoding element.

11. The arrangement as defined in claim 10 wherein at least one decoding means responds to a predefined number of contiguous, non-coded data symbols embedded in the hierarchical, variable length, encoded data sequence for generating the fixed length instruction at the predetermined value when the predefined number of symbols is stored in the storing means.

12. The arrangement as defined in claim 9 further comprising:
- means responsive to a predetermined pattern of symbols from the hierarchical, variable length encoded data sequence for initializing the partial address related to a particular decoding element in a predetermined one of the plurality of decoding means.

13. The arrangement as defined in claim 10 further comprising:
- means responsive to a predetermined pattern of symbols from the hierarchical, variable length encoded data sequence for initializing the partial address related to a particular decoding element in a predetermined one of the plurality of decoding means.

14. The arrangement as defined in claim 1 further comprising:
- memory means for storing at least one address partially identifying a location for a first variable length, decoding tree network in said decoding means;
- second means for storing an address partially identifying a location of a second variable length, decoding tree network in said decoding means in response to the selection instruction;
- means responsive to the control instruction for selecting as a decoder address one from a group consisting of the selection instruction from the decoding means, the address from the memory means partially identifying the location for the first variable length, decoding tree network in said decoding means, and the address from the second storing means partially identifying the location of the second variable length, decoding tree network in said decoding means; and
- means for concatenating a symbol from the hierarchical, variable length, encoded data sequence with the decoder address to form a complete address, the complete address indicating the actual location of a desired variable length, decoding tree network.

* * * * *